US012803588B2

(12) United States Patent
Rubin et al.

(10) Patent No.: US 12,803,588 B2
(45) Date of Patent: Nov. 17, 2026

(54) ESTIMATING LONG-TERM BLOCK ERROR RATE

(71) Applicant: MELLANOX TECHNOLOGIES, LTD., Yokneam (IL)

(72) Inventors: Amir Rubin, Kiryat Ono (IL); Lavi Koch, Jerusalem (IL); Vishnu Balan, Austin, TX (US)

(73) Assignee: Mellanox Technologies, Ltd, Yokneam (IL)

( * ) Notice: Subject to any disclaimer, the term of this patent is extended or adjusted under 35 U.S.C. 154(b) by 8 days.

(21) Appl. No.: 18/817,275

(22) Filed: Aug. 28, 2024

(65) Prior Publication Data

US 2025/0350300 A1 Nov. 13, 2025

Related U.S. Application Data

(60) Provisional application No. 63/643,939, filed on May 8, 2024.

(51) Int. Cl.
*H03M 13/01* (2006.01)

(52) U.S. Cl.
CPC .................................. *H03M 13/015* (2013.01)

(58) Field of Classification Search
CPC .................................................... H03M 13/015
See application file for complete search history.

(56) References Cited

U.S. PATENT DOCUMENTS

| | | | | |
|---|---|---|---|---|
| 9,876,727 | B2 | 1/2018 | Gaist et al. | |
| 12,375,256 | B1 * | 7/2025 | Shrikhande | H04L 1/0045 |
| 2013/0061115 | A1 * | 3/2013 | Imai | H03M 13/09 714/763 |
| 2015/0349807 | A1 * | 12/2015 | Vernon | H03M 13/3715 714/774 |
| 2022/0337359 | A1 * | 10/2022 | Iwai | H04L 43/50 |
| 2023/0343408 | A1 * | 10/2023 | Lee | G11C 29/52 |
| 2025/0252027 | A1 * | 8/2025 | Zhang | G06F 11/3037 |

* cited by examiner

*Primary Examiner* — Joseph D Torres
(74) *Attorney, Agent, or Firm* — Meitar Patents Ltd.; Daniel Kligler

(57) ABSTRACT

A method includes receiving a set of codewords of a Forward Error Correction (FEC) code, each codeword including a plurality of code symbols. A temporal distribution of erroneous code symbols is estimated over the set of codewords. A long-term Block Error Rate (BLER) associated with the set of codewords is estimated based on the temporal distribution of the erroneous code symbols.

10 Claims, 2 Drawing Sheets

| | Hist[0] | Hist[1] | Hist[2] | Hist[3] | Hist[4] | Hist[5] | Hist[6] | Hist[7-15] |
|---|---|---|---|---|---|---|---|---|
| #Cases | 4.5e8 | 6.1e7 | 4.2e6 | 1.4e5 | 6.4e3 | 171 | 4 | 0 |
| Portion | 0.8732 | 0.1184 | 0.00815 | 2.717e-4 | 1.242e-5 | 3.325e-7 | 7.477e-9 | 0 |
| RS_SER | 2.5e-4 | 2.5e-4 | 2.5e-4 | 2.5e-4 | 2.5e-4 | 2.5e-4 | 2.5e-4 | 0 |
| BLER | 4.63e-28 | 4.63e-28 | 4.63e-28 | 4.63e-28 | 4.63e-28 | 4.63e-28 | 4.63e-28 | 0 |

*Table 1*

| | Hist[0] | Hist[1] | Hist[2] | Hist[3] | Hist[4] | Hist[5] | Hist[6] |
|---|---|---|---|---|---|---|---|
| #Cases | 4.616e8 | 5.1e7 | 2.938e6 | 1.167e5 | 3631 | 94 | 2 |
| Portion | 0.8969 | 0.0993 | 0.00571 | 2.267e-4 | 7.054e-6 | 1.824e-7 | 4.025e-9 |
| RS_SER | 2.0e-4 | 2.04e-4 | 2.08e-4 | 2.12e-4 | 2.165e-4 | 2.21e-4 | 2.25e-4 |

*Table 2*

| | Hist[16] | Hist[17] | Hist[18] | Hist[19] |
|---|---|---|---|---|
| #Cases | 0 | 0 | 0 | 0 |
| Portion | 1.5565e-27 | 1.823e-29 | 2.545e-29 | 3.5533e-29 |
| RS_SER | 2.7e-4 | 2.746e-4 | 2.8e-4 | 2.856e-4 |

*Table 3*

FIG. 4

ESTIMATING LONG-TERM BLOCK ERROR RATE

CROSS-REFERENCE TO RELATED APPLICATIONS

This application claims the benefit of U.S. Provisional Patent Application 63/643,939, filed May 8, 2024, whose disclosure is incorporated herein by reference.

TECHNICAL FIELD

The present description relates generally to digital communication systems, and particularly to methods and systems for estimating error rates of Forward Error Correction (FEC) codes.

BACKGROUND

Many communication systems use Forward Error Correction (FEC) codes to reduce error rates when communicating over a noisy or distorted channel. One common type of FEC code is the Reed-Solomon (RS) code. A RS codeword comprises a predefined number of RS symbols (also referred to herein as "code symbols" or simply "symbols" for brevity). A given number of symbols in each codeword are uncoded data symbols, and the remaining symbols are redundancy symbols generated according to the code. In one example RS code, each codeword comprises 544 symbols, of which 514 are data symbols and 30 are redundancy symbols. This code can correct up to 15 erroneous RS symbols.

SUMMARY

An embodiment that is described herein provides a method including receiving a set of codewords of a Forward Error Correction (FEC) code, each codeword including a plurality of code symbols. A temporal distribution of erroneous code symbols is estimated over the set of codewords. A long-term Block Error Rate (BLER) associated with the set of codewords is estimated based on the temporal distribution of the erroneous code symbols.

In some embodiments, the FEC code is a Reed-Solomon (RS) code. In an embodiment, estimating the temporal distribution includes calculating, for a plurality of integer values k, respective fractions of the codewords in the set having k erroneous code symbols. In some embodiments, estimating the long-term BLER includes estimating, for a plurality of integer values k, respective k-specific Symbol Error Rates (SERS), and deriving the long-term BLER from the k-specific SERs.

In an example embodiment, deriving the long-term BLER from the k-specific SERs includes (i) combining the k-specific SERs to produce a joint SER, and (ii) deriving the long-term BLER from the joint SER. In an alternative embodiment, deriving the long-term BLER from the k-specific SERs includes (i) deriving respective k-specific BLERs from the k-specific SERs, and (ii) combining the k-specific BLERs to produce the long-term BLER.

In some embodiments, receiving the codewords is performed by a receiver, and the method further includes, using the estimated long-term BLER, accelerating one or more of (i) debugging, (ii) optimization and (iii) problem identification, in a performance of the receiver. In an embodiment, receiving the codewords is performed by a receiver, and the method further includes, using the estimated long-term BLER, reducing a duration, and/or improving a screening quality, of a production process used for manufacturing at least part of the receiver.

In an example embodiment the method further includes, using the estimated long-term BLER, identifying a degraded-performance communication link among a plurality of communication links. In a disclosed embodiment the method further includes, using the estimated long-term BLER, optimizing design performance of a communication link. In an embodiment the method further includes, using the estimated long-term BLER, reducing a power consumption of a communication link while meeting a performance target of the communication link.

There is additionally provided, in accordance with an embodiment that is described herein, an apparatus including a decoder and a BLER estimator. The decoder is to receive a set of codewords of a Forward Error Correction (FEC) code, each codeword including a plurality of code symbols, and to decode the received codewords. The BLER estimator is to estimate a temporal distribution of erroneous code symbols over the set of codewords, and, based on the temporal distribution of the erroneous code symbols, to estimate a long-term BLER associated with the set of codewords.

The present description will be more fully understood from the following detailed description of the embodiments thereof, taken together with the drawings in which:

BRIEF DESCRIPTION OF THE DRAWINGS

FIG. 4 shows tables of example BLER estimation results, in accordance with embodiments that are described herein.

DETAILED DESCRIPTION OF EMBODIMENTS

Overview

When evaluating the error performance of a RS-coded signal, two types of error rates can be defined:

- Symbol Error Rate (SER): The rate of erroneous RS symbols, regardless of error correction (e.g., at the input to the RS decoder).
- Block Error Rate (BLER): The rate of erroneous RS codewords after error correction (i.e., the rate of RS codewords in which the number of erroneous symbols exceeds the number of correctable errors of the RS code).

Due to the error correction capability of the code, the BLER is typically many orders of magnitude smaller than the SER (e.g., a BLER on the order of $10^{-28}$ for a SER on the order of $10^{-4}$). Although such a small BLER is obviously an advantage, it does pose a challenge in some respects. For example, in some cases it is desirable to estimate the long-term BLER of a communication link. When the BLER is so small, the time needed to encounter a sufficient number of erroneous codewords, so as to enable a reliable BLER estimation, may be prohibitively long.

Embodiments that are described herein provide methods and systems for estimating the long-term BLER within a short time period, based on the temporal distribution of symbol errors prior to error correction. In practical scenarios, the disclosed techniques can estimate the long-term BLER without encountering even a single erroneous codeword.

System Description

Figure 1:
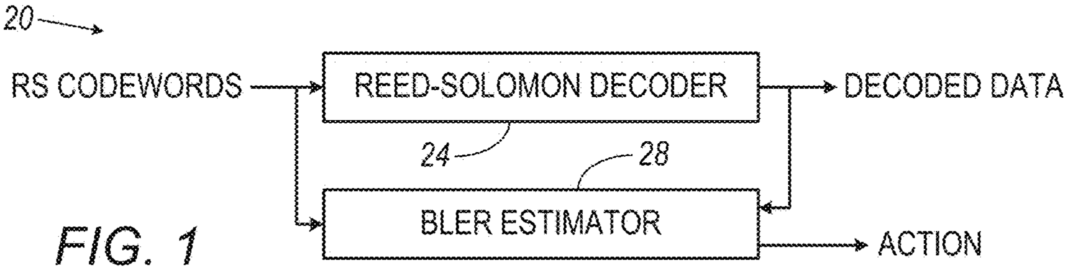
FIG. 1 is a block diagram that schematically illustrates a receiver, in accordance with an embodiment that is described herein.

FIG. 1 is a block diagram that schematically illustrates a receiver 20, in accordance with an embodiment that is described herein. As seen in the figure, receiver 20 comprises a Reed-Solomon (RS) decoder 24 that receives a sequence of RS codewords, decodes the codewords and outputs a stream of decoded data. Receiver 20 further comprises a Block Error Rate (BLER) estimator 28, which estimates the long-term BLER of the received codewords using the techniques disclosed herein. BLER estimator 28 may initiate a suitable action when the estimated BLER reaches a defined level or range (e.g., unacceptably high, exceedingly low, or acceptable).

Since the BLER estimation is based on symbol errors prior to error correction, the BLER estimator may produce reliable BLER estimates within a short time period, even when the decoded data is 100% error free.

Receivers such as receiver 20 may be used in various systems and applications that benefit from fast estimation of long-term BLER. One typical application is in a receiver of a Serializer-Deserializer (SERDES), e.g., in a port of a network device. A non-limiting list of possible use-cases and applications includes the following:

- Accelerating debugging, optimization, and identification of problems in physical-layer (PHY) receiver performance.
- Reducing (e.g., minimizing) the duration, and improving (e.g., optimizing) the screening quality, of a mass production process of receivers or receiver components.
- Fast identification of degraded-performance or otherwise problematic links, in real-life deployments comprising multiple links.
- Optimizing design performance in real-life deployments, by rapidly triggering helpful system flows when needed.
- Reducing (e.g., minimizing) the power consumption of a communication link, while still meeting performance targets. In clusters that comprise multiple communication links (e.g., lanes), the vast majority of links exceed their target performance by large margins that allow meaningful power reduction, without missing performance targets.

The configuration of receiver 20 shown in FIG. 1 is an example configuration that is chosen purely for the sake of conceptual clarity. In alternative embodiments, any other suitable configuration can be used. For example, the disclosed techniques are not limited to RS codes, and may be used for estimating the long-term BLER for other suitable FEC codes. Elements that are not necessary for understanding the principles of the present solution have been omitted from the figure for clarity.

The various elements of receiver 20, including RS decoder 24 and BLER estimator 28, may be implemented in hardware, e.g., in one or more Application-Specific Integrated Circuits (ASICs) or FPGAS, in software, or using a combination of hardware and software elements. In some embodiments, certain receiver elements, e.g., some or all of the BLER estimator and/or RS decoder, may be implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Example Long-Term BLER Estimation Methods

Figure 2:
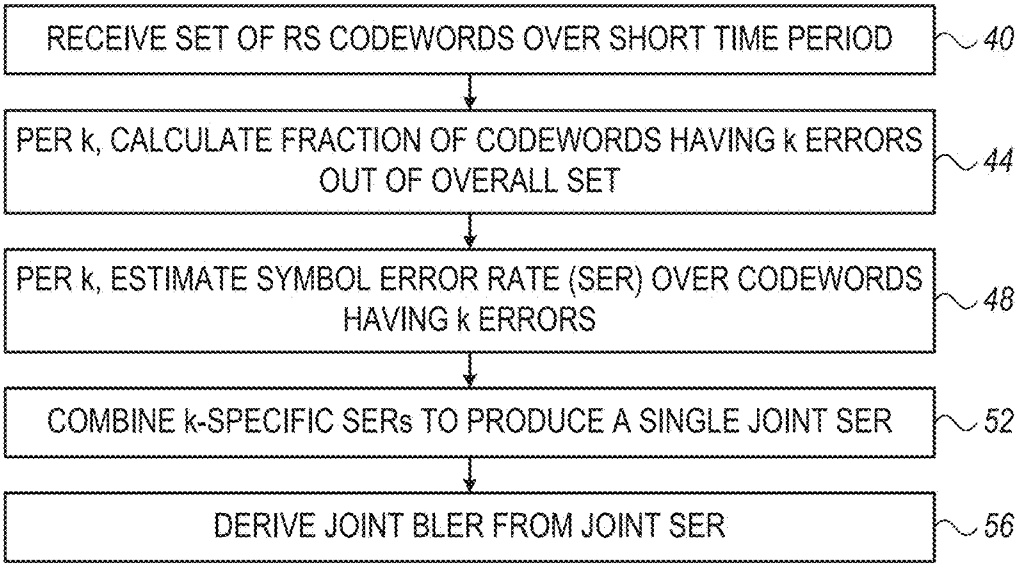
FIGS. 2 and 3 are flow charts that schematically illustrates methods for Block Error Rate (BLER) estimation, in accordance with embodiments that are described herein.

FIG. 2 is a flow chart that schematically illustrates a method for Block Error Rate (BLER) estimation, in accordance with an embodiment that is described herein. The method begins with BLER estimator 28 receiving a set of RS codewords over a certain time period, at a code word reception stage 40. In one example, the set comprises approximately $5 \cdot 10^8$ codewords of the format described above, received over a period of 28 seconds. The number of erroneous symbols per codeword, denoted k, will typically vary statistically from one codeword to another.

BLER estimator 28 accumulates the error statistics per value of k. In the description below, the subset of codewords having k erroneous symbols is denoted Hist[k]. Thus, for example, Hist[0] is the subset of error-free codewords, Hist[1] is the subset of codewords having a single erroneous symbol, etc. For each value of k, the BLER estimator calculates the number of codewords in Hist[k]. This number is denoted "#Cases".

At a fraction calculation stage 44, BLER estimator 28 calculates the fraction of "#Cases" out of the overall number of codewords in the set. This fraction is denoted "Portion".

From "Portion", the BLER estimator estimates a SER value denoted "RS_SER", at a SER estimation stage 48. For a given k, RS_SER is defined as the SER that, if present, would cause the fraction of erroneous codewords to be "Portion". The BLER estimator may use any suitable technique for deriving "RS_SER" from "Portion". In one example, the BLER estimator searches for the value of "RS_SER" that best fits the formula:

$$\text{Portion }[k] = Binopdf\,(k, N, \text{RS\_SER}) = \text{Choose }(k, N) * SER^{k} * (1 - SER)^{(N-k)}$$

wherein Binopdf denotes the probability distribution function of the Binomial distribution, and N denotes the number of RS symbols in a codeword. Any suitable search process can be used, e.g., binary search.

At SER combining stage 52, BLER estimator 28 combines the multiple k-specific RS_SER values to produce a single joint RS_SER estimate. In an alternative embodiment, the BLER estimator may estimate the joint RS_SER by direct calculation of the ratio (Number of erroneous RS symbols/Total number of RS symbols) over the testing period.

At a BLER estimation stage 56, BLER estimator 28 uses the joint RS_SER to estimate a joint long-term BLER. The long-term BLER is defined as the rate of codewords in which the number of erroneous symbols exceeds the error correction capability of the code. In the above example, in which the code is able to correct up to 15 errors per codeword, the long-term BLER is the rate of codewords containing 16 or more erroneous symbols. The BLER estimator may derive the long-term BLER by calculating:

$$BLER = \text{Sum over } i = t + 1 \text{ to } N \text{ of: } (Binopdf(i, N, SER))$$

where N denotes the number of RS symbols per codeword, and t denotes the maximal number of correctable symbols per codeword.

Figure 3:
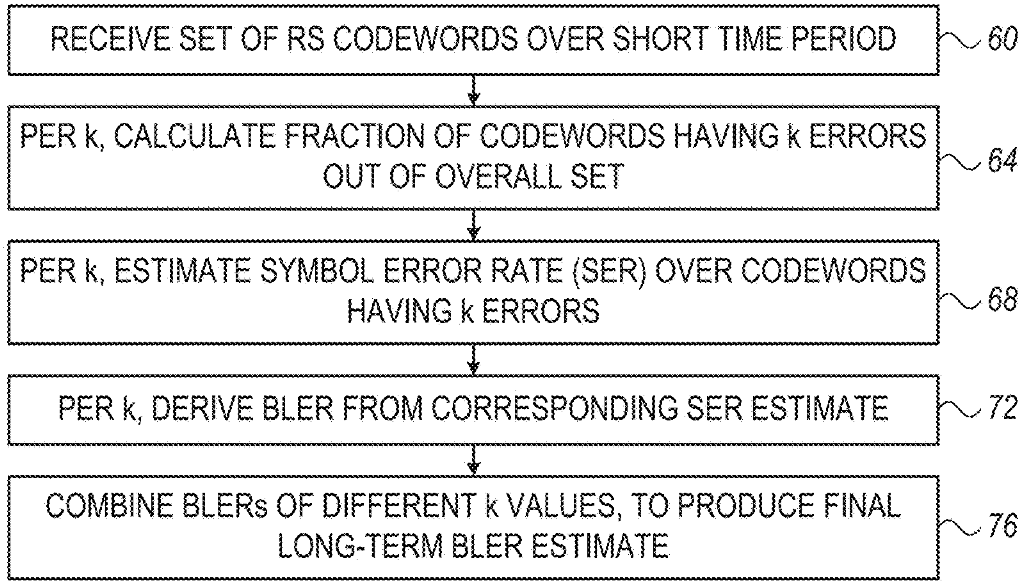

FIG. 3 is a flow chart that schematically illustrates a method for Block Error Rate (BLER) estimation, in accordance with an alternative embodiment that is described herein. The method of FIG. 3 differs from the method of FIG. 2 above, in that BLER estimator 28 does not combine the multiple k-specific RS_SER values to produce a single joint RS_SER estimate and then derives a single joint BLER. Instead, BLER estimator 28 estimates the long-term BLER separately for each k, based on the corresponding RS_SER estimate for that value of k. The BLER estimator then combines the multiple k-specific BLERs to produce the final long-term BLER estimate.

The method of FIG. 3 begins with a codeword reception stage 60, a fraction calculation stage 64 and a SER estimation stage 68. Stages 60, 64 and 68 are similar or identical to stages 40, 44 and 48 of FIG. 2, respectively.

Then, at a BLER derivation stage 72, BLER estimator 28 derives a k-specific BLER separately for each k, from the corresponding RS_SER estimate for that value of k. At a combining stage 76, BLER estimator 28 combines the multiple k-specific BLERs to produce the final long-term BLER estimate.

EXAMPLE RESULTS

FIG. 4 shows tables of example BLER estimation results, in accordance with embodiments that are described herein.

The table labeled "Table 1" gives example results of the calculations outlined above, for the example code described above.

The BLER estimator then combines the multiple k-specific BLER values to produce the final long-term BLER estimate. In the example above, the resulting BLER is the same for all values of k, and therefore this value is also used as the final BLER estimate.

In other cases, the BLER value may differ for different values of k. In such cases, BLER estimator 28 uses a suitable method for combining the multiple BLER values to a single estimate of the long-term BLER. Any suitable method can be used for this purpose. For example, the BLER estimator may extrapolate the RS_SER from the non-empty histograms to generate extrapolated values for the histograms implying FEC decoding errors. The extrapolation may be based on an analytically expected model or on a model derived by simulation.

For example, assume a model in which we expect an increase by a factor of 1.02 in the estimated RS_SER from hist[k] to hist[k+1] up to hist[19], then a drop to zero from hist[20] onwards. In this case we can extrapolate as shown in the tables labeled "Table 2" and "Table 3" in FIG. 4 (Table 2 showing some of the non-empty histograms, and Table 3 showing some of the empty histograms). Extrapolation by a factor of 1.02 leads to an estimated BLER of $\sim 1.635 \cdot 10^{-27}$, based on summing the BLER values.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
using a receiver:
receiving a set of codewords of a Forward Error Correction (FEC) code, each codeword comprising a plurality of code symbols, and decoding the received codewords;
estimating a distribution of erroneous code symbols over the set of codewords; and
based on the distribution of the erroneous code symbols, estimating a long-term Block Error Rate (BLER) associated with the set of codewords, by estimating, for a plurality of integer values k, respective k-specific Symbol Error Rates (SERs), and deriving the long-term BLER from the k-specific SERS; and
managing the receiver, or a system comprising the receiver, based on the estimated long-term BLER.

2. The method according to claim 1, wherein the FEC code comprises a Reed-Solomon (RS) code.

3. The method according to claim 1, wherein estimating the distribution comprises calculating, for the plurality of integer values k, respective fractions of the codewords in the set having k erroneous code symbols.

4. The method according to claim 1, wherein deriving the long-term BLER from the k-specific SERs comprises:
combining the k-specific SERs to produce a joint SER; and
deriving the long-term BLER from the joint SER.

5. The method according to claim 1, wherein deriving the long-term BLER from the k-specific SERs comprises:
deriving respective k-specific BLERS from the k-specific SERs; and
combining the k-specific BLERs to produce the long-term BLER.

6. The method according to claim 1, receiving managing the receiver comprises accelerating one or more of (i) debugging, (ii) optimization and (iii) problem identification, in a performance of the receiver.

7. The method according to claim 1, wherein managing a system comprising the receiver comprises identifying a degraded-performance communication link among a plurality of communication links.

8. The method according to claim 1, wherein managing a system comprising the receiver comprises optimizing design performance of a communication link.

9. The method according to claim 1, wherein managing a system comprising the receiver comprises reducing a power consumption of a communication link while meeting a performance target of the communication link.

10. The method according to claim 1, wherein managing the receiver or the system comprises performing one or more of the following using the estimated long-term BLER: (i) debugging the receiver, (ii) optimizing the receiver, (iii) identifying a problem in a performance of the receiver, (iv) testing the receiver in a production process, (v) identifying a degraded performance of a communication link comprising the receiver, and (vi) assessing a power consumption of the communication link comprising the receiver.

* * * * *